(12) United States Patent
Kochar et al.

(10) Patent No.: US 12,190,029 B2
(45) Date of Patent: Jan. 7, 2025

(54) SELF-SERVICE ARTIFICIAL INTELLIGENCE PLATFORM LEVERAGING DATA-BASED AND PHYSICS-BASED MODELS FOR PROVIDING REAL-TIME CONTROLS AND RECOMMENDATIONS

(71) Applicant: BERT LABS PRIVATE LIMITED, Karnataka (IN)

(72) Inventors: Rohit Kochar, Bangalore (IN); Jayesh Jain, Bangalore (IN); Yasin Khan, Bangalore (IN)

(73) Assignee: BERT LABS PRIVATE LIMITED, Bengaluru (IN)

( * ) Notice: Subject to any disclaimer, the term of this patent is extended or adjusted under 35 U.S.C. 154(b) by 834 days.

(21) Appl. No.: 16/833,588

(22) Filed: Mar. 28, 2020

(65) Prior Publication Data

US 2020/0311326 A1  Oct. 1, 2020

(51) Int. Cl.
*G06F 30/27* (2020.01)
*G06N 20/00* (2019.01)
*G09B 23/06* (2006.01)

(52) U.S. Cl.
CPC ............. *G06F 30/27* (2020.01); *G06N 20/00* (2019.01); *G09B 23/06* (2013.01)

(58) Field of Classification Search
CPC ........ G06F 30/27; G06N 20/00; G09B 23/06; G05B 13/0265; G05B 13/04; G05B 2219/2614
See application file for complete search history.

(56) References Cited

U.S. PATENT DOCUMENTS

| | | |
|---|---|---|
| 9,612,591 B2 | 4/2017 | Sloop et al. |
| 2011/0161059 A1 | 6/2011 | Jain et al. |
| 2015/0323948 A1 | 11/2015 | Jeong et al. |
| 2018/0106279 A1 | 4/2018 | Schiphorst et al. |
| 2019/0057065 A1 | 2/2019 | Takahashi et al. |
| 2019/0378020 A1* | 12/2019 | Camilus ................. G06N 20/00 |

* cited by examiner

*Primary Examiner* — Nha T Nguyen
(74) *Attorney, Agent, or Firm* — Maschoff Brennan

(57) ABSTRACT

The present disclosure relates to development of a self-service artificial intelligence platform by integrating data-based model with physics-based model and vice-versa to generate real-time recommendations and control actions. Further, the present disclosure provides the system and method for at least one of data collection and preparation, developing a hybrid system/control model, and developing a physics-based model driven by data-based model and vice versa to generate real-time recommendations and control actions.

16 Claims, 7 Drawing Sheets

SELF-SERVICE ARTIFICIAL INTELLIGENCE PLATFORM LEVERAGING DATA-BASED AND PHYSICS-BASED MODELS FOR PROVIDING REAL-TIME CONTROLS AND RECOMMENDATIONS

FIELD OF INVENTION

The present disclosure relates to integration of data-driven models with physics-based models for enterprise applications, such as HVAC, power generation, energy efficiency, thermal comfort, process equipment efficiency, process line optimization, predictive maintenance of machines, etc.

BACKGROUND OF THE INVENTION

Global demand for sustainable utilization and optimization of enterprise applications, such as, but not limited to, Heating, Ventilation, and Air-Conditioning (HVAC), power generation, energy efficiency, thermal comfort, process equipment efficiency, process line optimization, predictive maintenance of machines, etc. has been increasing in past few years. To meet this demand, several simulation tools, software, and models have been developed. A model is theoretically defined as a conceptual, physical or mathematical abstraction of a real object, phenomenon, process or system. There are several approaches, such as database approach (black box model), physics-based approach (white box model), and hybrid approach (grey-box model) to model enterprise applications.

The data-based model is a data-driven model, which collects and correlates the experimental or performance data from an operational field. The data-based model utilizes input and output variables to obtain a correlation using either statistical, machine learning, or deep learning approaches. In general, the data-based models are quick to execute and often accurate in recommending or predicting parameters and in optimizing business objectives, and decision-making and establishing 360 degree controls. However, the data-based model requires a large volume of upfront data and a long training period for a successful run. Further, the data-based model also requires high quality, clean data, and data with high level of granularity to generate consistent and explicable recommendations and controls. The data based model is typically trained to cover large and out of normal operating conditions, while building model constraints as defined and fed in the model. However, the data-based model is typically not trained to cover large and out of range operating conditions which leads to errors.

The physics-based model involves physical principles, such as physical behavior of a system, mass balance, energy balance, mathematical equations, thermodynamic equations, etc. to collect and correlate data. Although the physics-based model does not require a large quantity of data to generate recommendations, it requires significant run-time for computation along with complete understanding of underlying physics, which is at times not understood. Further, the physics-based model works in an ideal scenario and does not consider realistic problems such as building deterioration, corrosion of equipment, etc. Therefore, the physics-based model does not help in real-time operations and decision making.

The hybrid model, known as the grey-box model, integrates both data-based model and physics-based model to eliminate the inherent limitations of both the data-based model and the physics-based model. The hybrid model, therefore, utilizes available physical and data-based modelling tools to predict recommendations of a complex system.

U.S. Pat. No. 9,612,591 describes a system to optimize energy consumption in a building using a grey-box model. The system receives signals from a variety of sensors located inside the building and generates and predicts thermal response based on energy characteristics, measurements from sensors, and weather data associated with the building.

Another US patent application 20110161059A1 describes construction of grey-box model using subspace system identification to determine heat transfer in buildings. WO application 2018106279A1 describes system and methods for the mutual improvement of physics-based and data-driven models related to an oilfield.

US patent application 20190057065A1 describes a modeling device using a mathematical model and a statistical model together. The modeling device models a device that performs a simulation using the constructed model of modeling target, such as data from sensors using data processed from mathematical and statistical model information. Further, the data processed is corrected by prediction unit while performing prediction.

US patent application 20150323948A1 describes analyzing and predicting energy consumption information in real-time using the remote data obtained from building attribute information, facility operation and status information, energy consumption information, environment information and real-time commissioning information. However, the application gathers data remotely and is therefore time consuming and inaccurate.

Although there are several prior-art citations describing combining the physics-based model and the data-based model i.e. grey-box model to predict data in the real-time, there is a need to develop a grey box model which would predict the data and optimize business objectives in real-time using artificial intelligence or machine learning or deep learning techniques.

Further, the grey-box modeling described in the prior-art does not consider the missing and variable data inaccuracy and design specifications in the both physics-based and data-based model, which further leads to inaccurate and inconsistent recommendation.

The prior-arts do not describe the data-based model training through feature extraction and virtual sensors via the physics-based model. Therefore, at times the data-based model cannot assimilate the data obtained from physics based models and vice versa. This leads to inaccurate recommendations due to lack of training of both the models. The prior-art citations do not address this limitation and are therefore inaccurate, inconsistent and non-interpretable.

Therefore, there is a need to develop a hybrid model, which would incorporate training of the data-based model with the physics-based aspects, such as feature extraction and virtual sensors and vice-versa to further provide consistent and interpretable recommendations and dynamic and accurate controls. Further, there is also a need to develop a model which would incorporate artificial intelligence to validate data and generate recommendations and execute controls in real-time.

SUMMARY OF THE INVENTION

This summary is provided to introduce a selection of concepts in a simple manner that is further described in the detailed description of the disclosure. This summary is not intended to identify key or essential inventive concepts of the subject matter nor is it intended for determining the scope of the disclosure.

An example of a method to optimize enterprise applications comprises configuring a data-based model using historical field data of an enterprise and configuring a physics-based model using simulated data of the enterprise. The method comprises validating data obtained through the data-based model by identifying a sub-component of the enterprise application, extracting features of the sub-component through the physics-based model, obtaining data from virtual sensors through the physics-based model, and training the data based model using the data obtained from field sensors. Further, the method includes providing feedback to the physics-based model based on field observations through the data-based model and predicting a consistent control action based on the data generated through the data-based model and accepted by the physics-based model.

To further clarify advantages and features of the present disclosure, a more particular description of the disclosure will be rendered by reference to specific embodiments thereof, which is illustrated in the appended figures. It is to be appreciated that these figures depict only typical embodiments of the disclosure and are therefore not to be considered limiting of its scope. The disclosure will be described and explained with additional specificity and detail with the accompanying figures.

BRIEF DESCRIPTION OF FIGURES

In the following drawings like reference numbers are used to refer to like elements. Although the following figures depict various examples of the invention, the invention is not limited to the examples depicted in the figures.

DETAILED DESCRIPTION

In the present disclosure, relational terms such as first and second, and the like, may be used to distinguish one entity from the other, without necessarily implying any actual relationship or order between such entities. The following detailed description is intended to provide example implementations to one of ordinary skill in the art, and is not intended to limit the invention to the explicit disclosure, as one of ordinary skill in the art will understand that variations can be substituted that are within the scope of the invention as described.

Any particular and all details set forth herein are used in the context of some embodiments and therefore should NOT be necessarily taken as limiting factors to the attached claims.

While aspects of proposed disclosure may be implemented in any number of different computing systems, environments, and/or configurations, the embodiments are described in the context of the following exemplary environment.

The present disclosure attempts to overcome the problems of the existing art by providing a system and method for optimizing enterprise applications, such as energy efficiency, thermal comfort, process equipment efficiency, process line optimization, predictive maintenance of machines, etc.

The present disclosure relates to a system and method for optimizing an enterprise application, wherein the system and the method integrates a data-based model with a physics-based model. The data-based model obtains and stores historical field data from a database and the physics-based model obtains and stores simulated data.

In accordance to a preferred embodiment of the present disclosure, the method and system is capable of performing at least one of: (a) validating and reconciling the data obtained through the data-based model; (b) identifying and extracting features using the physics-based model; (c) obtaining data from virtual sensors through the physics-based models and training the data-based model using the data obtained; (d) modeling sub-component for the physics-based model using the data-based model; (e) providing a feedback to the physics-based model based on field observations through the data-based model; (f) and predicting a consistent and interpretable control action and/or recommendation based on the final data generated through the data-based model and accepted by the physics-based model.

Figure 1:
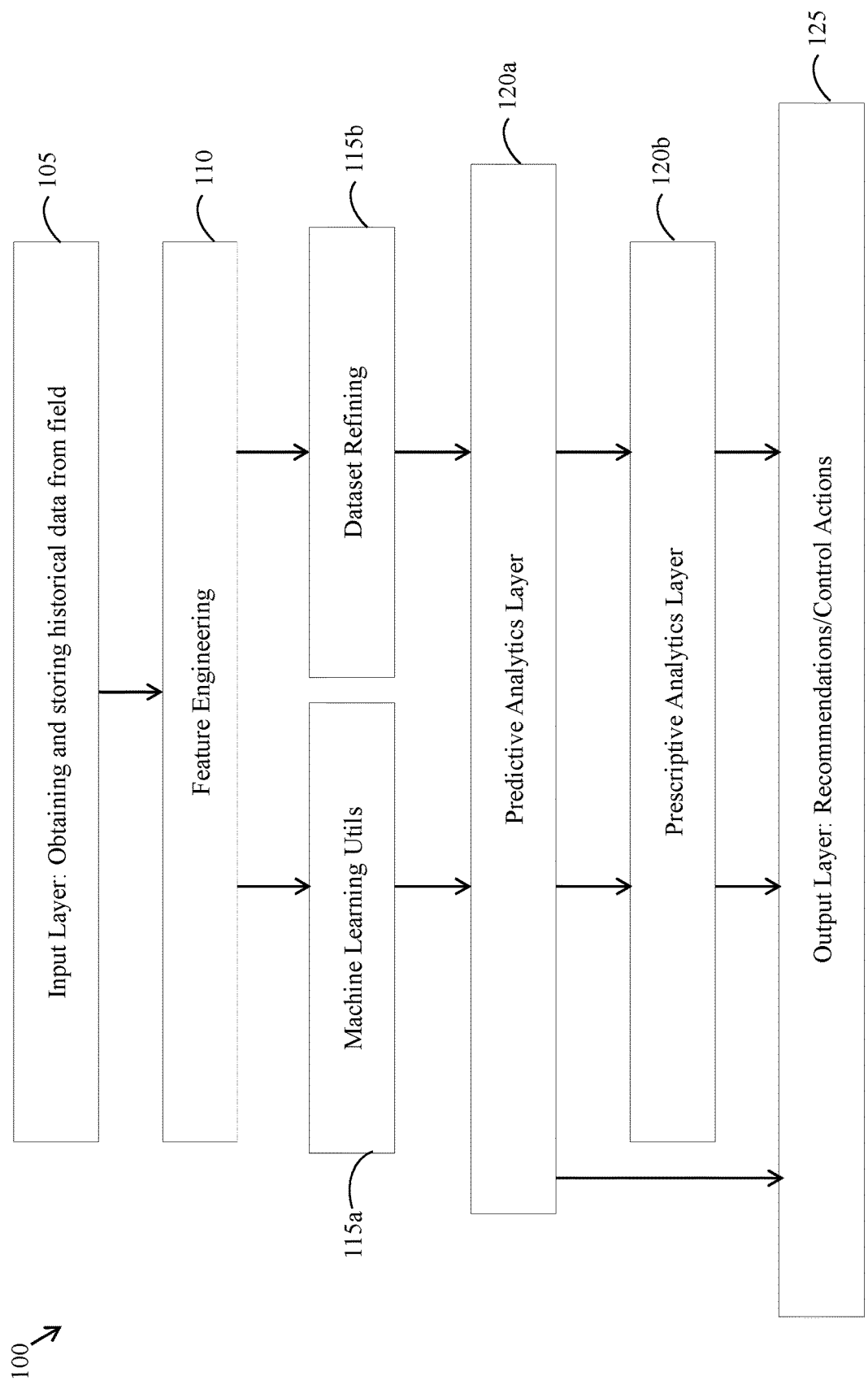
FIG. 1 illustrates a data-based model, in accordance to an embodiment of the present disclosure.

In accordance with an embodiment of the present disclosure, FIG. 1 illustrates the data-based model (100) comprising of, but not limited to, five layers. The first layer (105) of the data-based model (100) is an input layer for receiving/obtaining and storing historical data from field. The second layer (110) is a feature engineering layer for identifying and selecting features. Further, the second layer (110) also comprises functions including, but not limited to, at least one of feature selection, feature extraction, aggregation of the data, data transformation, auto-encoding of the data, and discretization. The third layer (115) comprises of two layers: machine learning (115a) and dataset refinement (115b). The machine learning (115a) performs functions for, but not limited to, at least one of anomaly detection, data clustering, regression and time series analysis and data classification. The dataset refinement (115b) performs the functions for, but not limited to, at least one of data imputation, noise removal from the data, normalization and standardization of the data, and the dataset sampling and partitioning. The fourth layer (120) comprises of two layers: predictive analytics layer (120a) and prescriptive analytics layer (120b). The predictive analytics layer (120a) performs the functions for, but not limited to, at least one of constraint based model selection, training, and scoring and traditional based selection, validation and scoring. The prescriptive analytics layer (120b) performs the functions for, but not limited to, at least one of rule extraction and action formation. The fifth layer (125) is an output layer, which generates and reports recommendations and control actions.

Figure 2:
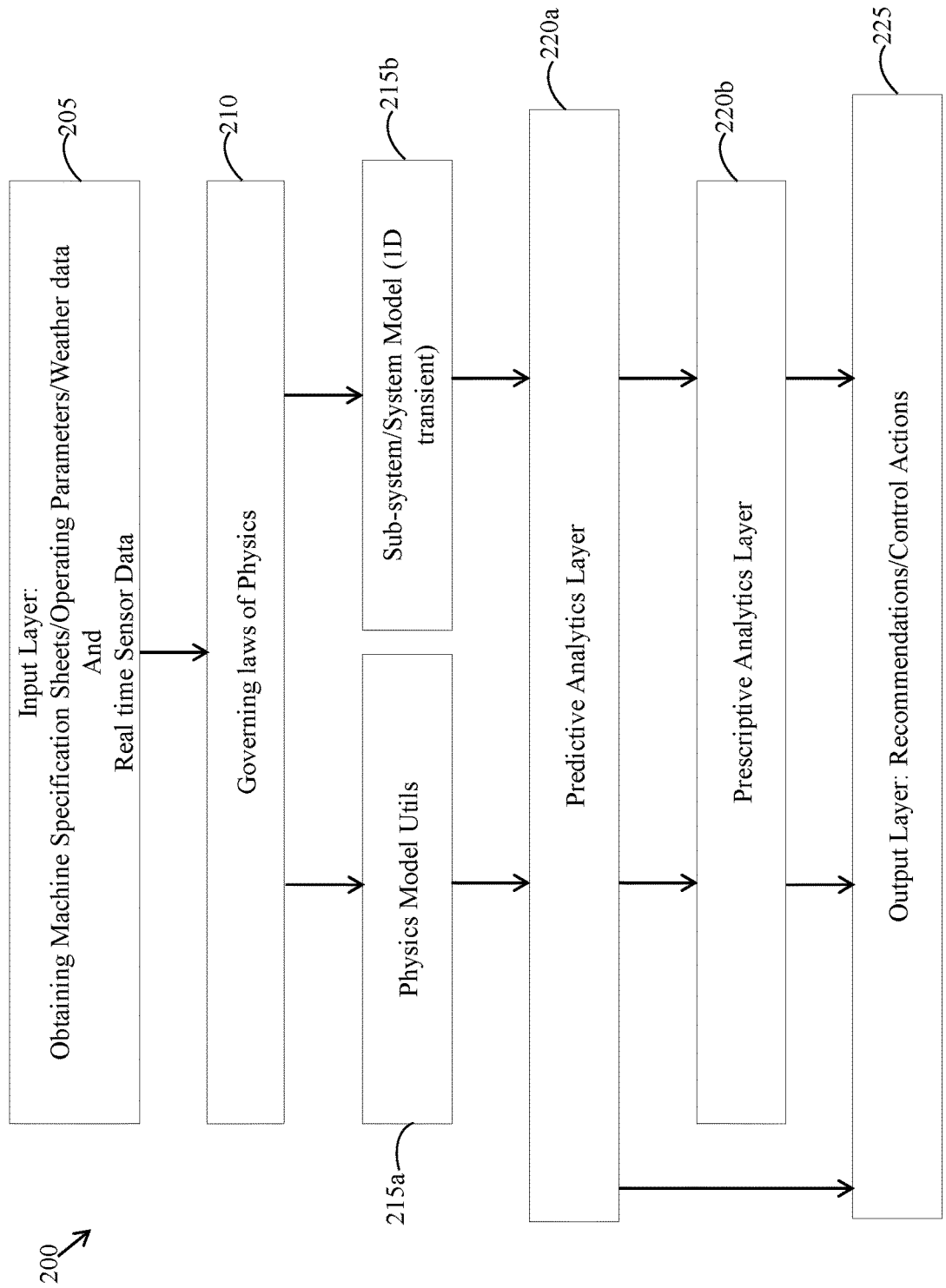
FIG. 2 illustrates a physics-based model, in accordance to an embodiment of the present disclosure.

In accordance with an embodiment of the present disclosure, FIG. 2 illustrates the physics based model (200) comprising of, but not limited to, five layers. The first layer (205) is an input layer, which obtains, but not limited to, at least one of machine specification Sheets, operating parameters, weather data and real time sensor data. The second layer (210) is a training layer to operate on the basis of governing laws of physics, such as, but not limited to, at least one of thermodynamics, mass energy balance, electromagnetism, mechanics, electrical, and heat and mass transfer operations. The third layer (215) comprises of two parts: the physics-model utility function (utils) (215a) and Sub-system/System Model (1D transient) (215b). The physics-model utils (215a) perform functions based on, but not limited to, at least one of mathematical differential equation, 1D network model, 3D computational fluid dynamics (CFD) models, and empirical models. The Sub-system/System Model (215b) operates based on, but not limited to, at least one of machine information/data, building information/data, and thermal zone. The fourth layer (220) comprises of two layers: the predictive analytics layer (220a) and the prescriptive analytics layer (220b). The predictive analytics layer (220a) performs the functions for, but not limited to, at least one of constraint based model selection, training, and scoring and traditional based selection, validation and scoring. The prescriptive analytics layer (220b) performs the functions for, but not limited to, at least one of rule extraction and action formation. The fifth layer (225) is an output layer, which reports recommendations and control actions based on dynamic graphic user interface (GUI) intuitive and generates simple dashboards.

In a feature of the present disclosure, the first input layer (105 and 205) and two outer most layers (120-125 and 220-225) are common comprising Inputs and Outputs, respectively between both the database and the physics-based models. While Input layer (105 and 205) content varies between both the models, with the data-based model (100) needing huge amount of good quality data and the physics-based model requiring details about machine specifications and operational regime with limited input sensor data, the output layers (i.e. 120-125 and 220-225) remains the same, which is predictive and prescriptive recommendations to drive automated business actions. Further, the two internal layers (110-115 and 220-225) vary significantly between both the approaches and these differences are what make the most of the strengths and weaknesses of the individual approaches.

Figure 3:
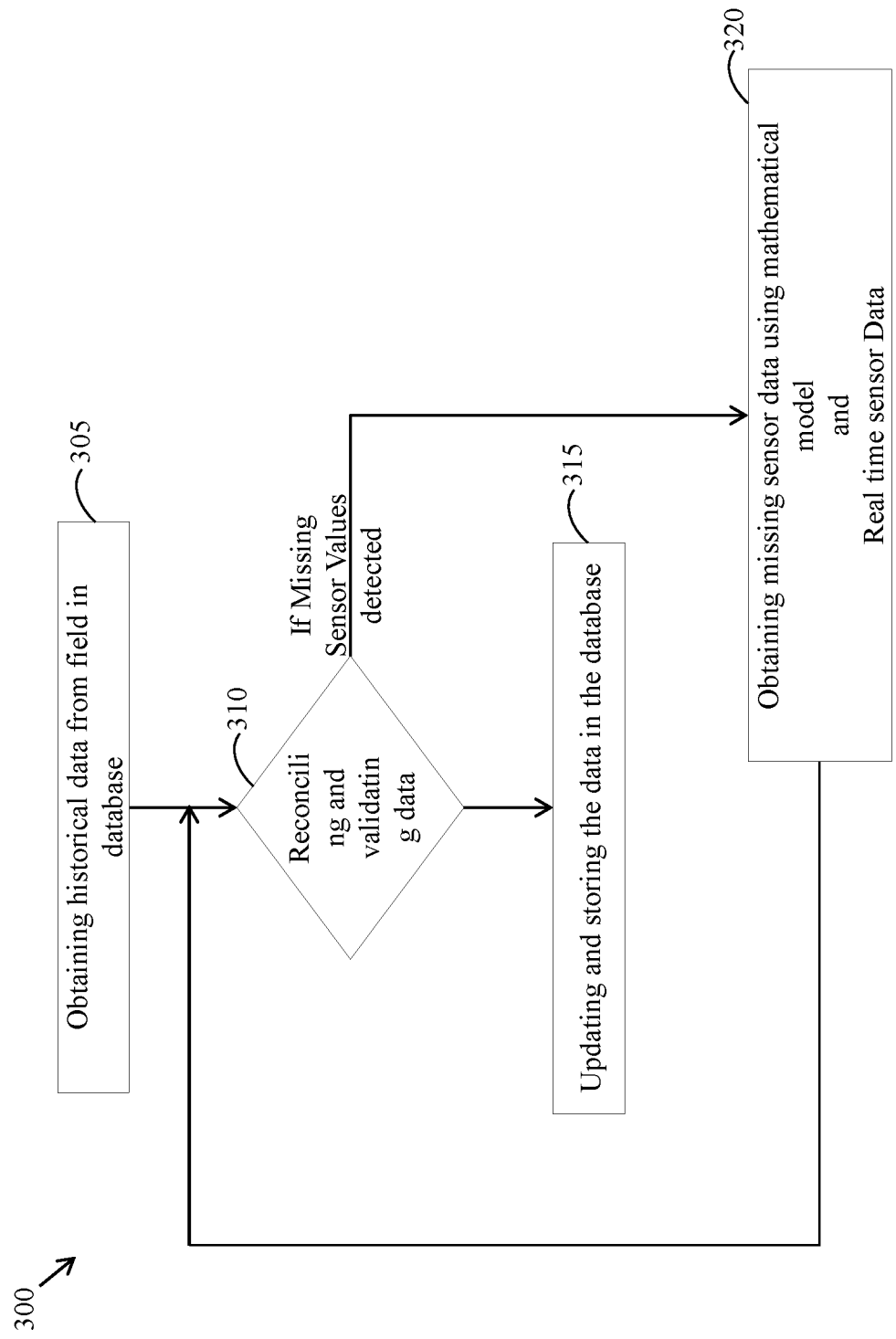
FIG. 3 illustrates a method for data reconciliation and validation, in accordance to an embodiment of the present disclosure.
Figure 4:
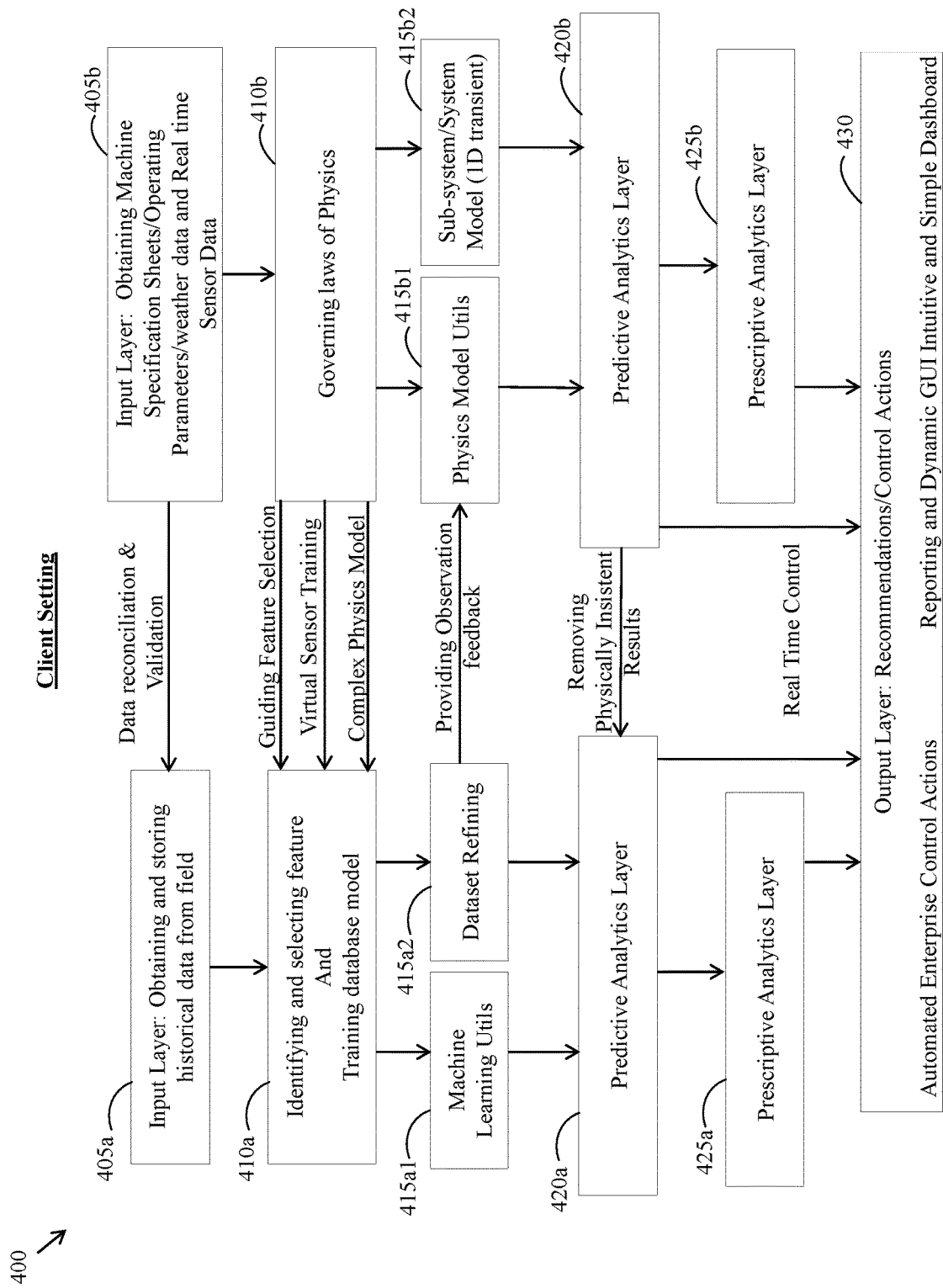
FIG. 4 illustrates a method for optimizing an enterprise application, in accordance to an embodiment of the present disclosure.

In accordance to an embodiment of the present disclosure, FIGS. 3-4 provide exemplary methods describing specific instances leveraging the strength of individual models to optimize enterprise application. The order in which the methods 300-400 are described is not intended to be construed as a limitation, and any number of the described method blocks can be combined in any order to implement the method 300-400 or alternate methods. Additionally, individual blocks may be deleted from the method 300-400 without departing from the spirit and scope of the disclosure described herein.

Data Reconciliation and Validation:

The data-based model ideally requires not only significant amount of data but also the noise free data. In the absence of noise-free and significant data, the predictive data-based model will have limited accuracy in real field application scenarios. The few reasons for a bad quality data include random errors due to intrinsic sensor accuracy, systematic errors due to sensor calibration or faulty data transmission, and other errors due to leaks or missing sensor values. Although there are statistical based techniques to remove the outliers but, in the process, there is a significant amount of loss of data, which is again not desirable for the later stages of the data-based model development. To overcome this challenge, the present disclosure integrates mathematical equation based model and/or equality constraints, such as, but not limited to, mass balance and energy balance which represents the underlying physical process of the machine to automatically correct the sensor values or update the missing sensor values and further generate noise free data.

In an embodiment of the present disclosure, FIG. 3 illustrates a method for data reconciliation and validation. The method involves the steps 305-320 as explained below:

First step (305) involves obtaining and storing historical data from the field in the database.

Second step (310) involves reconciling and validating the data to detect erroneous or the missing sensor data values and generate noise free data.

Third step (315) involves updating and storing the validated data in the database to develop the data-based model.

If any missing or erroneous data is detected in the second step (310), then fourth step (320) involving obtaining the missing sensor data using, but not limited to, mathematical model and real time sensor data is performed. Further the missing sensor data obtained at step (320) is updated and stored in the database via the third step (315). Here the missing sensor data is obtained from data simulated and generated from the physics-based model.

Feature Selection and Guidance with the Physics-Based Model and the Data-Based Model Training Through the Virtual Sensors from the Physics-Based Models:

The next step of the data-based model is to identify features from the clean data. Although feature identification is achieved by evaluating various statistical techniques, it requires significant time and hence is an iterative process.

In existing art, the database machine learning/deep learnings model require huge amount of data set for self-training based on the identified features. In a typical client setting there are several cases wherein data granularity may be good, but the duration is not enough or vice-versa. In both the scenarios it reduces the chances of creating a good predictive and optimization model through deep learning. Further, the lack of data coverage and missing granularity leads to the development of inefficient models.

In an embodiment, the present disclosure provides priming of the data-based model with the understanding of the physics through mathematical models to provide the initial size and shape of data functions. The good initialization leads to faster feature identification from the data-based models enabling saving of total cycle time.

The present disclosure provides the physics-based model for the efficient self-deep learning of the data-based model. In a feature of the present disclosure, output of the physics-based model would become an input to the data-based model and help in reducing the number of hidden layers and training time.

In another feature of the present disclosure, loss function in neural nets is introduced based on the physics equations from the physics-based model to accelerate physically correct learning of the data-based model.

In yet another feature of the present disclosure, the data-based models are trained using reduced order models to enable real time calibration.

In an embodiment of the present disclosure, when the data is unavailable in the database, the physics-based model, having models of the virtual sensors, generate required independent variable values for the data-based model to learn. This results in building of a baseline data-based model offline. The baseline data-based model once deployed at client site starts receiving the real time data and further starts the self-learning. This result in a significant boost in terms of the control readiness of the data-based models and thus associated opportunity to bring better enterprise outcomes.

In another embodiment, the present disclosure provides real time filling of values for the missing sensors. At times, the sensors may fail and therefore may not measure certain key independent variables in the field. Here, the physics-based model takes the role of those sensors in the form of the virtual sensor and provide real time information to keep the data-based model architecture intact.

In an exemplary embodiment of the present invention, FIG. 4 illustrates a method for feature selection and guidance with the physics-based model and further the data-based model training through the virtual sensors from the physics-based model. The method involves the steps 405-410 as explained below:

The first Step (405a-b) involves reconciling and validating data using both the data-based model and the physics-based model.

In an embodiment of the present disclosure, the second step (410a-b) involves identifying and selecting features from the data obtained from the first step (410a) and further receiving guidance from the physics-based model (410b) to determine initial shape and size of the features and functions.

In another embodiment of the present disclosure, when the initial data is unavailable to develop the data-based model, the second step (410a-b) involves generating independent variable values from the physics-based model (410b) as the virtual sensors and feeds to the data-based model (410a) to train the data-based model.

In yet another embodiment of the present disclosure, when the sensors fails to provide real time filling of values in the data-based model, the second step (410a-b) involves generating independent variable values from the physics-based model (410b) as the virtual sensors and feeds to the data-based model (410a) to self-train the data-based model.

Complex Physics Component/Sub-System Modeling Using the Data from the Data-Based Model:

In an embodiment of the present disclosure, when a component or a sub-system, such as, but not limited to, cooling tower model, of the physics-based model works incorrectly or is not well understood from the physics perspective or is too complex to simulate, the data-based model is self-trained and then utilized as a function or equation to be a part of the physics-based model. Therefore, the physics-based model incorporates the real-time data from the data-based model to work or simulate the said component or the said sub-system.

The Data-Based Model Feedback to the Physics-Based Model from the Field Observations:

In general, real-field data and/or observations carries several insights, such as, but not limited to, corroded pipes and reduced efficiency of machines, which the physics-based model cannot simulate due to the ideal nature of the physics-based model.

In another embodiment of the present disclosure, the real-field observations are fed to the physics-based model in order to calibrate the physics-based model in real time and therefore making the model more accurate. In a feature of the present invention, the data-based model feedback to the physics-based model from the real-field observations work in a cyclic manner and enable to achieve a balance between bias i.e., the data-based models and variance i.e., the physics-based model.

Removal of Physically Inconsistent Recommendations and Providing the Recommendations Interpretable from the Data-Based Model:

In an embodiment of the present disclosure, at a final stage, wherein the data-based model is ready to predict the control action by obtaining a support from the physics-based model and vice-versa, a final check is implemented to ensure the recommendation provided by the data-based model is consistent and interpretable. Further, the physics-based model receives the recommendation from the data-based model. This enables the acceptance of the recommendations and the control actions generated from the data-based model easier at the client setting, especially for the speedy decision making, which directly determines the potential benefits.

In another embodiment of the present disclosure, physical inconsistencies are removed from the models during the training of deep learning model i.e. the data-based model and at the end of the training of the data-based model. Therefore, the physically inconsistent recommendations do not pass to the field.

In yet another embodiment of the present disclosure, the recommendations are provided in the form of at least one of supporting charts and calculations to allow client setting on the field to accept the outcomes from the data-based model.

In an exemplary embodiment of the present disclosure, FIG. 4 illustrates a method to develop a complex physics component/sub-system modeling using the data from the data-based model and providing the data-based model feedback to the physics-based model from the real-field observations. Further, FIG. 4 illustrates a method to generate final recommendations and control actions based on the real-field data and the simulated data, obtained from the data-based model and the physics-based model, respectively. The method is illustrated in the following steps:

In first step (410b1-b2): The physics-based model generates a simulated data in step and detects that the component or a sub-system is working incorrectly or is too complex to simulate.

In second step (415): An observation feedback is obtained from the data-based model in step (415a1-a2) and provided to the physics-based model (415b1-b2). The observation feedback is provided to the physics-based model in the form of at least one of the real-time filled observations and/or as the functions and equations.

In third step (420): The data obtained from the physics-based model is analyzed using predictive analytics techniques to extract physically consistent predictive data in step (420b) and provides the physically consistent data to the data-based model in step (420a).

In fourth step (425): The physically consistent data from the data-based model is analyzed using prescriptive analytics techniques in step (425a).

In an embodiment of the present disclosure, the predictive data from the physics-based model obtained from step (420b) is analyzed using the prescriptive analytics techniques in step (425b).

The prescriptive analytics step (420) generates at least one decision option and/or implication of the decision option obtained from the predictive data.

In fifth step (430), the recommendations and control actions are generated based on at least one of the predictive data and data/decision obtained from the prescriptive analysis of the data.

In an embodiment of the present disclosure, in the third step (420) the data from the data-based model is analyzed alone (420a) to extract and obtain the predictive data and further generate recommendations and control actions directly in fifth step (430).

In another embodiment of the present disclosure, in the third step (420) the data from the physics-based model is analyzed alone (420b) to extract and obtain the predictive data and further generate recommendations and control actions directly in fifth step (430).

A typical example of an enterprise application is the Heating, Ventilation, and Air-Conditioning (HVAC) system. In an HVAC system there are many subsystems or sub-components such as Air Handling Unit (AHU), Chiller etc. The method for optimizing the enterprise application, for example, the HVAC system broadly includes the following steps: Firstly, the method includes configuring the data-based model using historical field data of the enterprise. Configuring the data-based model is performed by first reconciling and validating the data to detect erroneous or missing sensor data values and generate noise free data and then updating and storing the validated data in a database to develop the data-based model. Secondly, the method includes configuring a physics-based model using simulated data of the enterprise. Configuring the physics-based model includes obtaining machine specification sheets and operating parameters of the enterprise application and then training the building of physics-based model to operate on basis of governing laws of physics, such as, but not limited to, one of thermodynamics, mass energy balance, electromagnetism, mechanics, electrical, and heat and mass transfer operations. Once the data-based model and the physics based model is developed and ready to be deployed with the enterprise application, then validation of the data is performed. Validating the data obtained through the data-based model includes identifying a sub-component of the enterprise application, for example, the AHU. Further, validation involves extracting features of the sub-component through the physics-based model, obtaining data from virtual sensors through the physics-based model and then training the data based model using the data obtained from field sensors where the AHU is deployed. Validating data obtained through the data-based model also includes removing inconsistencies from the models during the training. It is to be noted that the training is real time and is performed using a deep learning technique. However, it is to be construed that the training can also be done using artificial intelligence or machine learning techniques.

The next critical step is to provide real-time feedback to the physics-based model based on field observations through the data-based model. Once the feedback is provided, the model can predict consistent control action based on the data generated through the data-based model and accepted by the physics-based model. Providing real-time feedback to the physics-based model includes incorporating real-time data from the data-based model to simulate the sub-component, for example the AHU, and calibrating the physics-based model in real time to make the physics-based model more accurate. Predicting a consistent control action involves a constraint based model selection, training, and scoring and a traditional based selection, validation and scoring. Predicting a consistent control action further involves providing recommendation based on the data generated through the data-based model and accepted by the physics-based model.

As a test case, the real time response of an air handling unit serving an office space is considered, whose objective is to maintain the zone thermal temperature at 24 to 24.5 Deg C. while consuming minimum energy, which in turn optimizes the enterprise application, i.e. in this case the HVAC system. The figures, FIGS. 5A, 5B, and 5C shows the response of the enterprise application when trained with various models and is further explained in the following sections.

Figure 5A:
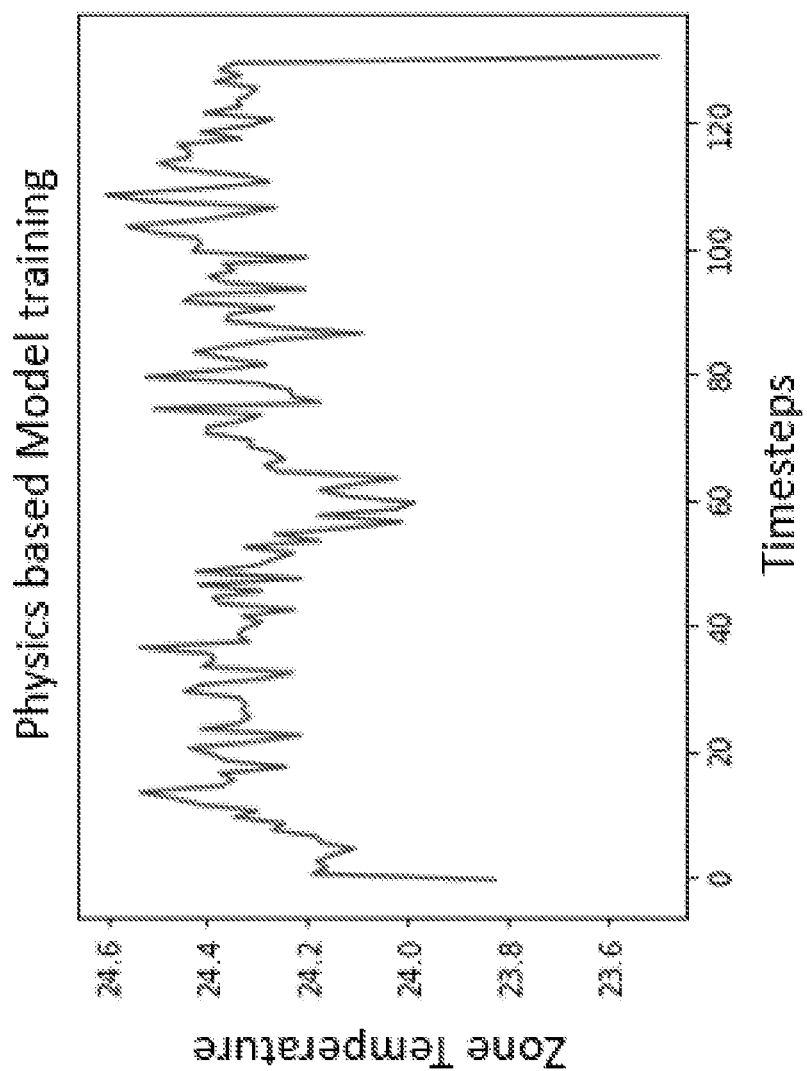
FIG. 5A is a graphical representation of an enterprise application response when deployed with a model trained with physics based simulation data.

FIG. 5A is a graphical representation of an enterprise application response when deployed with a model trained with physics based simulation data. The enterprise application is having a model which is a physics-based model configured and trained using simulated data of the enterprise. As shown in FIG. 5A, temperature is maintained in between 24 to 24.5 for most of the period, which is satisfactory.

Figure 5B:
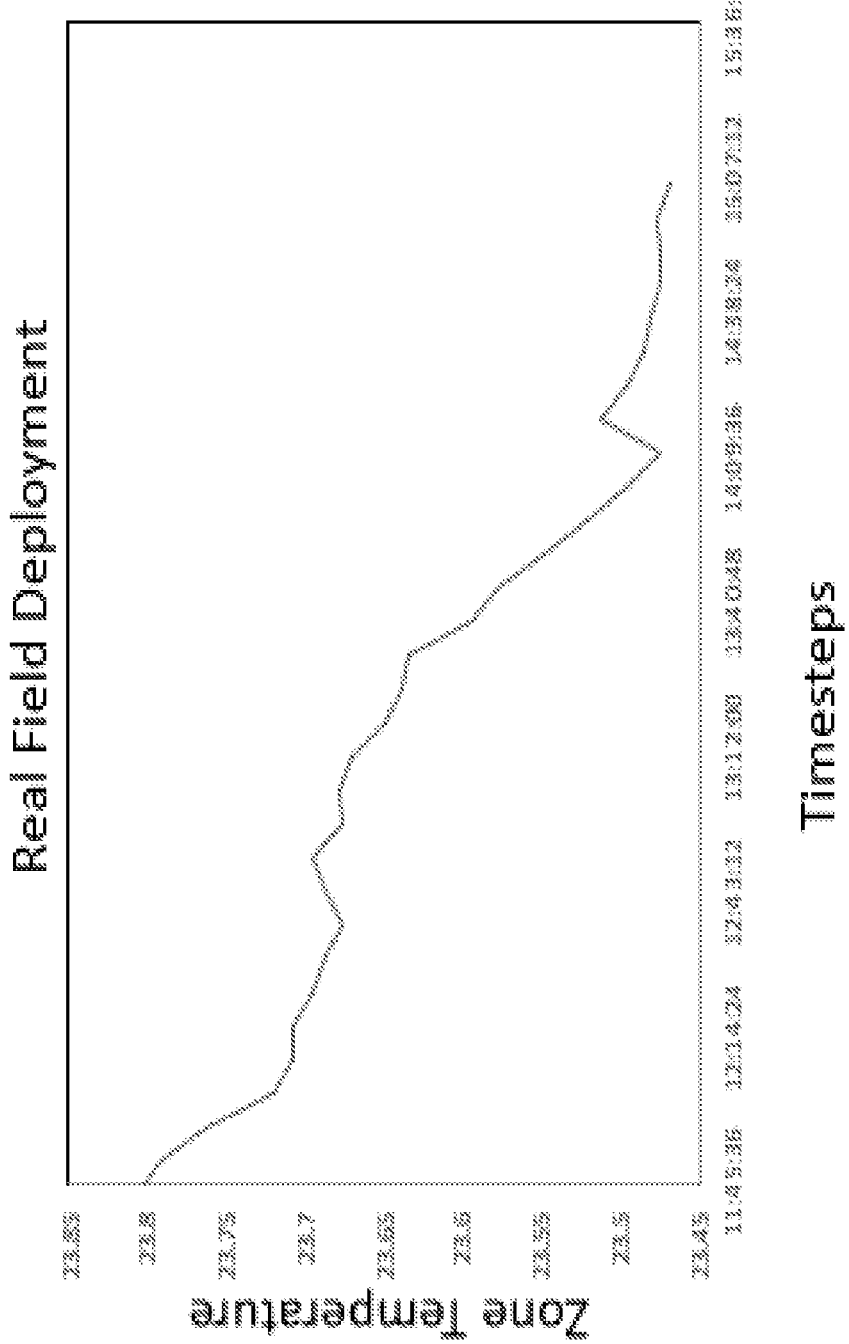
FIG. 5B is a graphical representation of the enterprise application response when deployed with a model trained with real time data.

Referring to FIG. 5B, FIG. 5B is a graphical representation of the enterprise application response when deployed with a model configured and trained with real time data. It is to be noted from the response that the same model when deployed on field, it is observed that the trained model does not perform optimally as temperature drops below 24 Deg C.

Figure 5C:
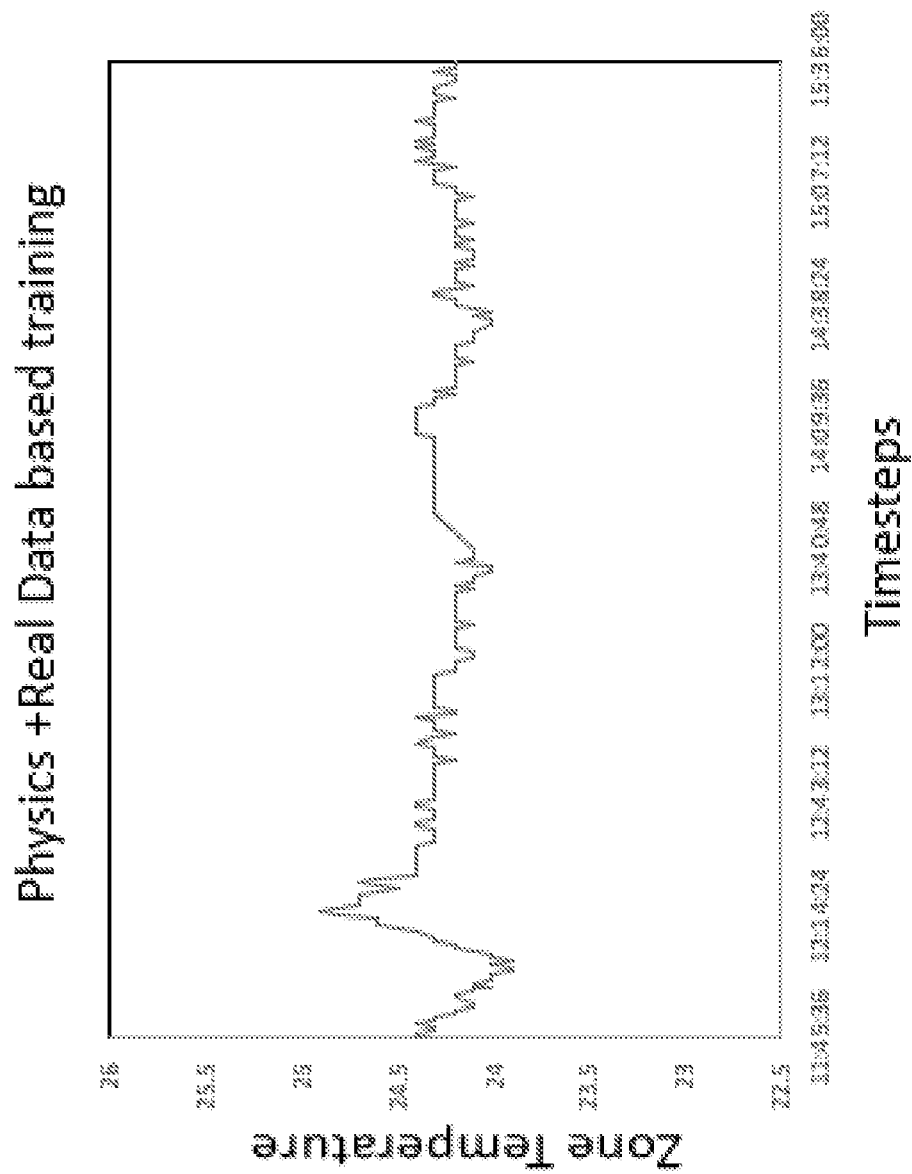
FIG. 5C is a graphical representation of the enterprise application response when deployed with a model trained with both real time data and physics based simulation data.

FIG. 5C is a graphical representation of the enterprise application response when deployed with a model trained with both real time data and physics based simulation data. With this model, real-time feedback is provided to the physics-based model based on field observations through the data-based model and vice versa. It can be observed from FIG. 5C that the physics based model trained along with real field data proved to be resulting in better results. It can be clearly seen that the actions taken are best when physics and real data (hybrid approach) both are used simultaneously. Using the model, one can predict a consistent control action based on the data generated through the data-based model and accepted by the physics-based model.

The system and method disclosed herein optimizes enterprise application by integrating the data-based model with the physics-based model and vice-versa. Further, the present disclosure provides the system and method for at least one of data collection and preparation, developing a hybrid system/control model, and developing the physics-based model driven by the data-based model and vice versa. The present disclosure provides a predictive model built on fundamentals to avoid imbalance between the bias and the variance. Further, the present disclosure enables that the outcome of both the models are consistent and interpretable. In addition, the present disclosure enables a quick turnaround during development phase and later during the real-time control execution phase, as well.

We claim:

1. A method for optimizing an enterprise application, the method comprising:
    configuring a data-based model using historical field data of an enterprise, wherein the data-based model includes a plurality of layers including a first layer, a second layer, a third layer, a fourth layer, and a fifth layer;
    configuring a physics-based model using simulated data of the enterprise, wherein the physics-based model includes a plurality of layers including a first layer a second layer a third layer, a fourth layer, and a fifth layer;
    validating data obtained through the data-based model by:
        identifying a sub-component of the enterprise application;
        extracting features of the sub-component through the physics-based model;
        obtaining data from virtual sensors through the physics-based model; and
        training the data-based model using the data obtained from field sensors;
    providing real-time feedback to the physics-based model based on field observations through the data-based model, to calibrate the physics-based model in real time and therefore making the model more accurate, wherein the data-based model feedback to the physics-based model from the real-field observations works in a cyclic manner and enables to achieve a balance between bias i.e., the data-based model and variance i.e., the physics-based model; and predicting a consistent control action based on the data generated through the data-based model and accepted by the physics-based model, wherein a final check is implemented to ensure the predicted control action is consistent and interpretable, wherein the physics-based model receives the predicted control action from the data-based model, which enables acceptance of recommendations and the predicted control actions at a client setting, for speedy decision making, which directly determines potential benefits.

2. The method as claimed in claim 1, wherein configuring the data-based model using historical field data of an enterprise comprises:

reconciling and validating the data to detect erroneous or missing sensor data values and generate noise free data; and updating and storing the validated data in a database to develop the data-based model.

3. The method as claimed in claim 1, wherein configuring the physics-based model comprises:

obtaining machine specification sheets and operating parameters of the enterprise application; and training the building of physics-based model to operate on basis of governing laws of physics, such as, but not limited to, one of thermodynamics, mass energy balance, electromagnetism, mechanics, electrical, and heat and mass transfer operations.

4. The method as claimed in claim 1, wherein validating data obtained through the data-based model comprises removing inconsistencies from the models during the training, wherein the training is performed using a deep learning technique.

5. The method as claimed in claim 1, wherein providing real-time feedback to the physics-based model comprises:

incorporating real-time data from the data-based model to simulate the sub-component; and calibrating the physics-based model in real time to make the physics-based model more accurate.

6. The method as claimed in claim 1, wherein predicting a consistent control action comprises:

a constraint based model selection, training, and scoring; and a traditional based selection, validation and scoring.

7. The method as claimed in claim 1, wherein predicting a consistent control action further comprises providing recommendation based on the data generated through the data-based model and accepted by the physics-based model.

8. The method as claimed in claim 1, wherein, in the data-based model, the first layer is an input layer for receiving and storing historical data from field, the second layer is a feature engineering layer for identifying and selecting features, the third layer includes machine learning and dataset refinement, the fourth layer includes predictive analytics layer and prescriptive analytics layer, and the fifth layer is an output layer, which generates and reports recommendations and control actions.

9. The method as claimed in claim 8, wherein the second layer includes functions including at least feature selection, feature extraction, aggregation of data, data transformation, auto-encoding of the data, and discretization.

10. The method as claimed in claim 9, wherein performing functions by the machine learning includes at least anomaly detection, data clustering, regression and time series analysis and data classification, and wherein performing functions by the dataset refinement includes at least data imputation, noise removal from the data, normalization and standardization of the data, and the dataset sampling and partitioning.

11. The method as claimed in claim 10, wherein performing functions by the predictive analytics layer includes at least constraint based model selection, training, and scoring and traditional based selection, validation and scoring, and wherein performing functions by the prescriptive analytics layer includes at least rule extraction and action formation.

12. The method as claimed in claim 1, wherein training of the data-based model further includes using reduced order models to enable real time calibration.

13. The method as claimed in claim 1, wherein, when the data is unavailable in a database, the physics-based model, having models of the virtual sensors, generates required independent variable values for the data-based model to learn, which results in building of a baseline data-based model offline, wherein the baseline data-based model once deployed at client site starts receiving real time data and further starts self-learning, which results in a significant boost in terms of control readiness of the data-based model and thus associated opportunity to bring better enterprise outcomes.

14. The method as claimed in claim 1, wherein, in the physics-based model, the first layer is an input layer, which obtains at least machine specification sheets, operating parameters, weather data, and real time sensor data, the second layer is a training layer to operate on the basis of governing laws of physics including at least thermodynamics, mass energy balance, electromagnetism, mechanics, electrical, and heat and mass transfer operations, the third layer includes physics-model utility function and sub-system/system model, the fourth layer includes a predictive analytics layer and a prescriptive analytics layer, and the fifth layer is an output layer, which reports recommendations and control actions based on dynamic graphic user interface (GUI) intuitive and generates simple dashboards.

15. The method as claimed in claim 14, wherein performing functions by the physics-model utility function is based on at least mathematical differential equation, ID network model, 3D computational fluid dynamics (CFD) models, and empirical models, and wherein operating of the sub-system/system model is based on at least machine information/data, building information/data, and thermal zone.

16. The method as claimed in claim 15, wherein performing functions by the predictive analytics layer includes at least constraint based model selection, training, and scoring and traditional based selection, validation and scoring, and wherein performing functions by the prescriptive analytics layer includes at least rule extraction and action formation.

* * * * *